United States Patent [19]
Bürkle et al.

[11] Patent Number: 5,658,439
[45] Date of Patent: Aug. 19, 1997

[54] PROCESS AND APPARATUS FOR APPLYING ORIENTING LAYERS TO A SUBSTRATE FOR ALIGNMENT OF LIQUID CRYSTAL MOLECULES

[76] Inventors: Roland Bürkle, Obere Paulusstrasse 71, 70197 Stuttgart; Traugott Kallfass, Gotenstrasse 7, 71723 Grossbottwar, both of Germany

[21] Appl. No.: 541,028

[22] Filed: Oct. 11, 1995

[30] Foreign Application Priority Data

Oct. 11, 1994 [DE] Germany ............ 44 36 285.4

[51] Int. Cl.$^6$ ............................................ C23C 14/34
[52] U.S. Cl. ..................... 204/192.23; 204/192.12; 204/192.15; 204/298.11; 204/298.17; 204/298.23; 204/298.26
[58] Field of Search ............ 204/192.12, 192.15, 204/192.23, 298.11, 298.17, 298.23, 298.26

[56] References Cited

U.S. PATENT DOCUMENTS 5,350,498  9/1994  Smith, Jr. ............... 204/192.23

FOREIGN PATENT DOCUMENTS 1-316459  12/1989  Japan .................. 204/298.23

OTHER PUBLICATIONS

T. Motohiro, et al. *Thin Solid Films*, vol. 185 pp. 137–144 (1990).

Primary Examiner—Aaron Weisstuch
Attorney, Agent, or Firm—Michael J. Striker

[57] ABSTRACT

A process of making an orienting layer on a substrate for aligning liquid crystal molecules, especially of a large-scale liquid crystal display, includes moving the substrate (14) at a distance of 50 to 100 mm from a target (11) past the target in a substrate motion direction (15) and providing the target with a length l in a direction perpendicular to the substrate motion direction and parallel to the substrate surface (S) at least equal to the width s of the substrate (14); sputtering material from the target (11) onto the substrate surface (S) by forming a gas plasma in a vacuum chamber containing the target; and orienting the target (14) relative to the substrate so that the cathode surface (CS) of the target is inclined at a surface inclination angle a of from 60° to 85° to the substrate surface so that the material is sputtered obliquely onto the substrate surface to form the orienting layer. Another target (12) may be provided for forming an insulating layer prior to forming the orienting layer

10 Claims, 2 Drawing Sheets

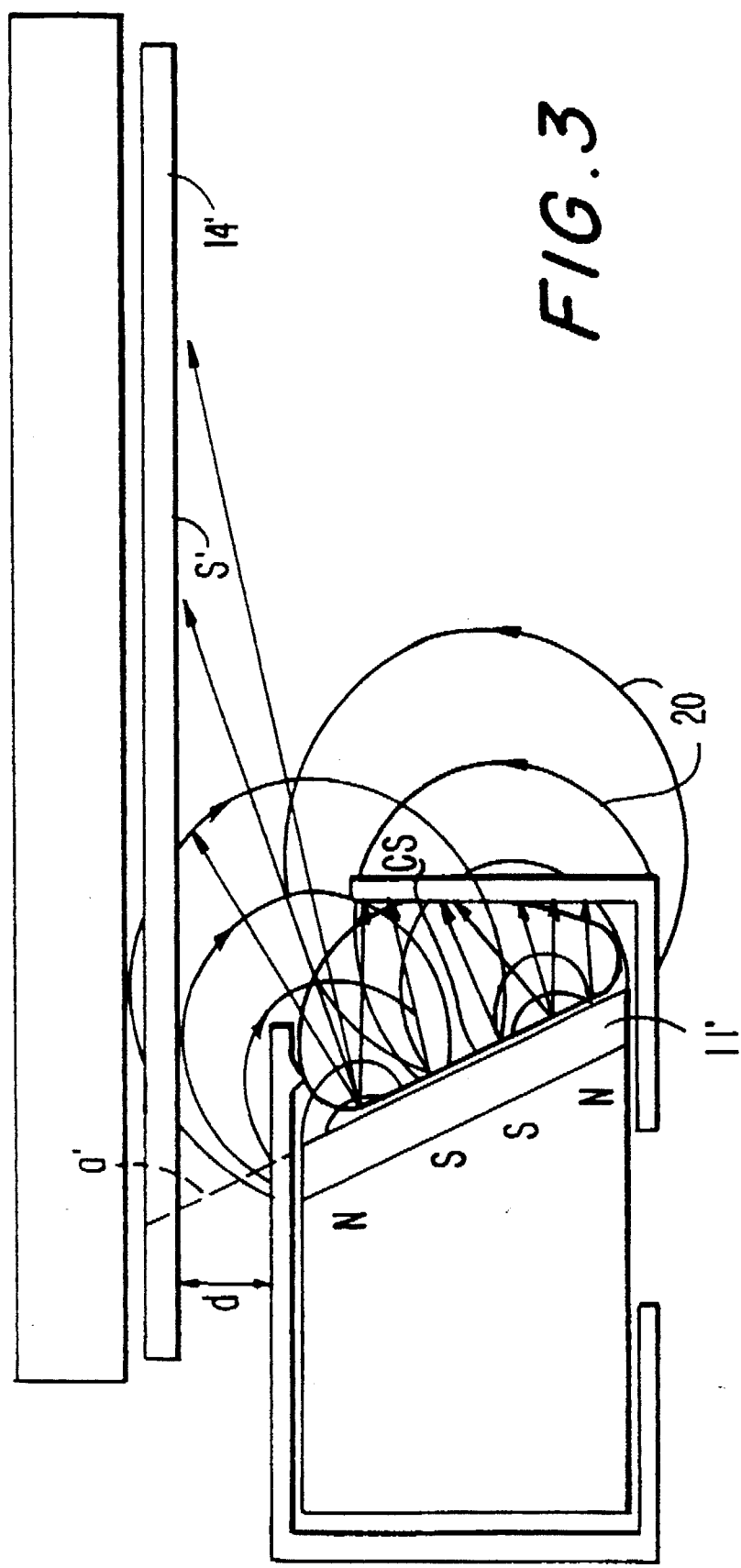

PROCESS AND APPARATUS FOR APPLYING ORIENTING LAYERS TO A SUBSTRATE FOR ALIGNMENT OF LIQUID CRYSTAL MOLECULES

BACKGROUND OF THE INVENTION

The present invention relates to a process and apparatus for applying orienting layers to a substrate for alignment of liquid crystal molecules, especially for large-scale liquid crystal displays by sputtering materials which tend to grow prismatic crystals on the substrate by plasma deposition.

The orientation of liquid crystal molecules of a display cell in a predetermined direction is crucial for operation of predominantly liquid crystal displays, especially of twisted nematic liquid crystal displays(TN-LCDs) or also ferroelectric liquid crystal displays(FLCDs). Because of this orientation of the "liquid crystals" their optical anisotropy can produce a macroscopically observable effect. This orientation generally occurs by application of an anisotropically orienting layer to the inner surfaces of each display substrate, before it is glued to a display comprising a covering and base substrate. Subsequently the liquid crystal is filled into the display. The orienting layers cause a recrystallization of the liquid crystal layers in a predetermined alignment.

Several different processes are already known for making these orienting layers, of which the most important are described here briefly with their advantages and disadvantages. $SiO_2$, for example from an electron beam vapor source, can be deposited as an orienting layer in a vacuum chamber on the inner substrate surface of a display at a very small angle of inclination of about 5° to the substrate surface. During growth of the $SiO_2$ layer prismatic crystals obliquely inclined in the direction of the vapor source on whose surfaces the liquid crystal molecules are deposited are produced. Because of the strongly anisotropic orientation of the oblique prismatic crystals a very impressive and homogeneous orientation results. The inclination angle of the prismatic crystals can be influenced to a certain extent by the vapor deposition parameters and thus also the so-called "edge tilt angle" of the liquid crystal molecules can be varied, which has a decisive effect on the switching properties of the display. Further, the manufacturing process for the orienting layers and thus the orientation properties are very reproducible by this vapor deposition. Furthermore, the orientation of the liquid crystals is very uniform. The $SiO_2$-layer is chemically very stable and sensitive to UV-light and high temperatures. Also the liquid crystal does not combine chemically with the $SiO_2$ layer and can not change, i.e. no or minor and extinguishable formation of transient images occurs (image sticking). Because of the comparatively large surface area and hydrophilic character of the $SiO_2$-prismatic crystals, on introduction of the liquid crystals into the display frequently a chromatic separation of the individual components of the liquid crystal mixture occurs, whereby the switching behavior of the display in the separated regions is changed. An additional disadvantage of this process is that the vapor deposition sources are usually point sources and thus deposition on a comparatively large surface in a uniform manner is not possible. The alignment of the prismatic crystals varies in the individual substrate regions, since the molecules issue or impinge on the substrate surface at different angles from the point source. The inhomogeneity of course can be reduced in one direction by arranging several vapor deposition sources in a line. Because of that, however, the vapor deposition performance of the individual sources must be carefully accurately regulated. Moreover a very large apparatus expense, and especially a comparatively large vacuum processing chamber with associated large scale pumps and air locks, are required, which can only be provided by a very costly special manufacturing process. These processes have only a very limited applicability to the making of large scale displays.

The most widely used methods for making of the orienting layers in the industrial manufacture of liquid crystal displays utilize organic layers such as polyimides, polyvinylalcohols or other plastic films which are flung or centrifuged on the substrates in a liquid phase. After a suitable drying and hardening process this plastic film which is a few nanometers thick is rubbed or ground with a carbon fiber or velvet brush in one direction. Because of that, microscopic comparatively small tracks or tears are produced in the layer and an orientation of the organic molecules and/or molecular chains occurs. The resulting micro-mechanical and/or molecular anisotropy of the film causes an orientation of the liquid crystals later filled into the display. The advantage of this process is that the size of the substrate surface plays no role or has no effect. This process is also comparatively economical; however it is only reproducible to a limited extent. The result of the orientation of the molecules depends on a very large number of process parameters such as the rubbing pressure of the velvet or carbon fiber brushes, rubbing strength, polymerization, and crystallization degree of the plastic film and its chemical properties as well as the surface reactions of the film with water from the air or from solvents. These process parameters can be optimized only with difficulty. Furthermore, the plastic layers are only comparatively poorly stable relative to temperature changes or UV light. With ferroelectric liquid crystals there is also the disadvantage that the organic molecules of the orienting film combine vigorously chemically with the organic liquid crystal molecules and thus are rotated with the liquid crystal molecules on application of an electric field or hold them in their position and thus make the required rotation of molecules difficult. The result is a so-called "burning-in" of written-in or stored images ("image sticking") or a monostable switching behavior of the normally bistable switching ferroelectric liquid crystal.

Besides the brushing or rubbing of plastic film an orientation of polymer films with the aid of linearly polarized UV-light is also known. The polymerization is direction-dependent so as to provide the required anisotropy because of the direction-dependence of the polarized light. The production of microstructure in a plastic layer by impression or stamping techniques or photolithography has already been tried. The disadvantage of comparatively poor long-term stability of the plastic layers relative to temperature changes and UV light exposure and the chemical reactivity of the plastic molecules with the liquid crystal molecules however cannot be eliminated by this process.

Also, already there have been sporadic suggestions regarding the possibility of an inclined sputtering or deposition of material with low pressure plasmas, which lead to prismatic growth. Aluminum nitride is a particularly suitable material for this type of deposition and leads to prismatic growth in a nitrogen atmosphere when the deposition is at comparatively large impingement angles to the substrate surface. However, when a comparatively large substrate surface must be sputtered from a point-like target difficulties which are similar to those encountered with vapor deposition result. Indeed large-surface area targets can be used here, whereby comparatively fewer inhomogeneities result because the sputtering processes are more diffuse in comparison to vapor deposition. However, these methods also simultaneously reduce the directional anisotropy required for the orientation of the prismatic crystals.

SUMMARY OF THE INVENTION

It is an object of the present invention to provide a process of sputtering an orienting layer on a substrate for liquid crystal molecules, which has a more uniform anisotropic orientation and a comparatively higher chemical and UV stability than orienting layers made by currently known processes, especially for large-scale substrates.

It is another object of the present invention to provide an apparatus for performing the aforementioned process.

According to the present invention, the process of forming an orienting layer on a substrate for aligning liquid crystal molecules, especially of a large-scale liquid crystal display, comprises the steps of:

a) moving the substrate closely past at least one target in a substrate motion direction and providing the at least one target with a length in a direction perpendicular to the substrate motion direction and parallel to the substrate surface at least equal to the width of the substrate;

b) sputtering material from the at least one target onto the substrate surface by forming a gas plasma in a vacuum chamber containing the at least one target; and c) orienting the at least one target relative to the substrate so that a cathode surface of the at least one target is inclined at a surface inclination angle to the substrate surface such that the material is sputtered obliquely onto the substrate surface from the target.

The apparatus for performing the process according to the invention includes a vacuum chamber in which the at least one target is arranged and a palette on which the substrate is moved past the at least one target. The cathode surface is advantageously inclined to a considerable extent in relation to the substrate surface.

For large-scale glass substrates for displays so-called vertical in-line sputtering devices for sputtering on thin layers are currently used. In this type of apparatus, the large glass substrate is suspended on a vertical palette, with which it is moved in a horizontal direction comparatively closely past a target extending in a vertical direction during the sputtering process in a vacuum chamber. The sputtering plasma is present between the target cathode and the palette and/or the shields of the target. A uniform layer growth may be achieved over the entire substrate surface in this device. The uniformity in the motion direction of the palette is achieved by the uniform motion of the substrate relative to the cathode over the entire substrate width. The homogeneity in the direction vertical or perpendicular to the motion direction of the substrate is achieved by the longitudinal extent over the entire substrate height. Furthermore, shielding baffles at the ends of the target can be provided which eventually compensate for the eventual sputtering inhomogeneities in this region.

In the apparatus according to the invention, the target surface is inclined relative to the substrate surface at an angle which is advantageously between 60° and 85°. The apparatus according to the invention may therefore be formed by modifying a currently known in-line-sputtering apparatus without extensive rebuilding and reengineering. Thus orienting layers can be sputtered on substrates with a comparatively high surface layer uniformity, also over a comparatively large surface area.

In preferred embodiments of the apparatus according to the invention, the spacing between the substrate and the target is comparatively small, so that the volume of the vacuum chamber can be small. Advantageously, the substrate can be spaced from 50 to 100 mm from the target as it is moved by it. This corresponds to from one to three times the mean free path of the molecules in the process gas so that the sputtered-on molecules do not lose their motion direction because of random collisions prior to reaching the substrate surface. The target cathode can be suitably shielded by shields to prevent plasma formation outside of the target surface and to limit the sputtering or deposition direction to the predetermined angular range on the substrate surface. The grown crystal layer has a well-defined orientation because of the atoms arriving from one side, i.e. a crystal lattice is formed so that it is oriented in a single direction. This directional anisotropy of the oriented layer later directs the liquid crystals inside of a completed and filled display in the desired way. The rate of deposition or sputtering is sufficient in spite of the narrow impingement angle. Furthermore, a lameliar-like shield can be arranged in front of the target, which catches the molecules which are inclined too much or too little and which would affect the orientation of the growing crystal lattice in an undesirable manner. Further, a magnetic field can be produced in front of the cathode surface of the target whose circular field lines extend in planes perpendicular to the surface of the cathode and parallel to the motion direction of the substrate. Because of that, in a known way the rate of sputtering can be increased while maintaining plasma power at the same level. Because the field lines have no components along the target, the orientation of the growing crystal lattice in the motion direction of the substrate is additionally aided. In the method according to the invention, high frequency alternating current plasmas may be produced which allow a deposition or sputtering of nonconducting and transparent materials such as quartz($SiO_2$) on the substrate, as these have particularly desirable properties for the orienting layer. Alternatively, metal oxide or metal nitride layers can be sputtered on the substrate by forming a direct current plasma and by adding to the plasma a reactive gas such as oxygen or nitrogen (reactive sputtering of oxides, nitrides or the like). The thin quartz layers with well-defined crystal orientation have a particularly good orienting effect especially with ferroelectric liquid crystal displays with cell thickness of about 1.5 micrometers. This type of quartz layer has a very good long-term stability and resistance to UV radiation. By selection of sputtering parameters such as pressure, temperature, sputtering power, and angle of impingement of the sputtered material, as well as selection of the reactive gas components, the layer properties can be varied over a wide range in a predetermined way.

Additional parallel sputtering targets can also be present in the apparatus according to the invention so as to provide several different layers prior to application of the orienting layer on the substrate. Particularly, an insulating layer made from a sputtered-on transparent dielectric is usually necessary on the image point electrodes because of the short circuiting probability between the rows and columns due to the required small cell spacing, especially in large-scale ferroelectric liquid crystal displays. In an apparatus with multiple targets, the insulating layer can be applied first in one machine cycle and then the orienting layer can be sputtered on, so that machine and process costs can be reduced.

BRIEF DESCRIPTION OF THE DRAWINGS

The objects, features, and advantages of the present invention will now be illustrated in more detail by the following detailed description, reference being made to the accompanying drawing in which:

FIG. 3 is a detailed cutaway cross-sectional view of a target surface of the apparatus according to the invention with vertical magnetic field lines.

DESCRIPTION OF THE PREFERRED EMBODIMENT

Figure 1:
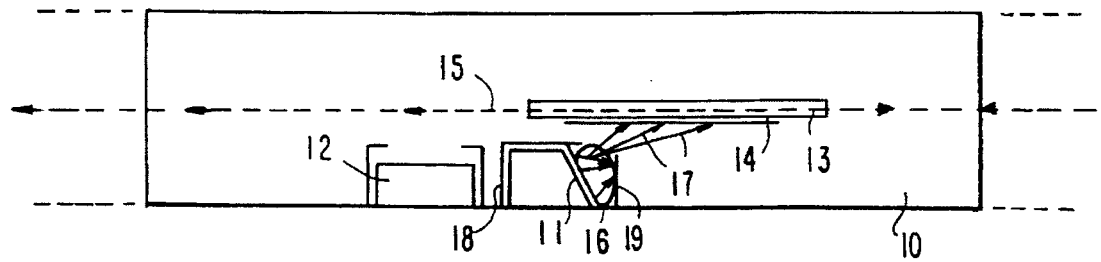
FIG. 1 is a transverse cross-sectional view through an apparatus for forming the orienting layer for aligning liquid crystal molecules according to the invention.
Figure 2:
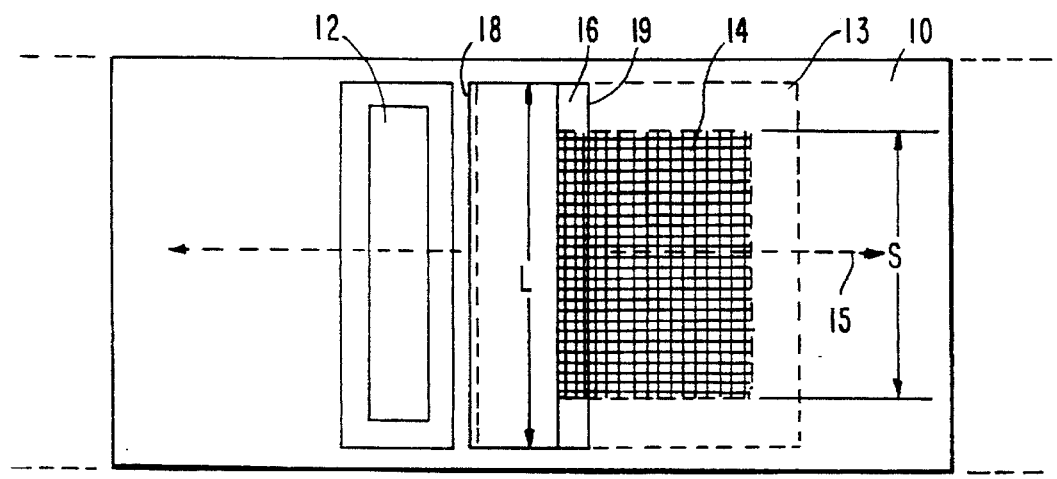
FIG. 2 is a top plan view of the apparatus shown in FIG. 1.

FIGS. 1 and 2 show a vacuum chamber 10 with a rectangular transverse cross-section with two targets 11 and 12. A substrate 14 arranged horizontally on a palette 13 is moved past these targets 11 and 12 in the direction of the arrow 15. Both targets 11 and 12 are rectangular, as shown in FIG. 2 and have a length l which is at least equal to the width s of the substrate 14 in a direction perpendicular to its direction of motion 15 and parallel to the substrate surface, S'. The cathode surface CS of the target 11 is inclined to a substantial extent at an inclination angle a relative to the surface S' of the substrate 14. A plasma 16 is formed in front of the cathode surface CS of the target 11, from which particles arrive on the surface S' of the substrate 14, as shown in FIG. 1 by the arrows 17. The sides of the target 11 are shielded by the shields 18 and 19 so that no plasma can form laterally to the target cathode 11. The shields 18 and 19 form an outlet for the particles 17 which is narrow enough so that particles impinge at the desired predetermined narrow angles on the surface S' of the substrate 14. Because of the narrow impingement angle range and because of the length l of the target 11, an extremely uniform orienting layer with anisotropic alignment properties is distributed uniformly over the entire substrate surface S' and is produced by a uniform motion of the substrate 14 past the target 11. A second target 12 with a noninclined target cathode surface can be used to make, e.g., an insulating layer prior to application of the orienting layer on the substrate.

Thus two layers may be sputtered one after the other on the substrate 14 during cyclic operation of the apparatus shown in FIGS. 1 and 2. The apparatus shown in FIGS. 1 and 2 may be obtained by modifying a commercial in-line-sputtering apparatus with two parallel targets of the same type as target 12 with horizontal sputtering devices. One of the targets is then replaced with a target with cathodes inclined to a substantial extent and provided with suitable shields.

FIG. 3 is a detailed cross-sectional view of a target 11', in front of which a magnetic field is provided, whose circular field lines 20 extend in a plane parallel to the drawing plane and which, because of that, assists in the orientation of growing prismatic crystals. These field lines extend up to the vicinity of the substrate 14'.

By "closely passing" in relation to the motion of the substrate past the targets is meant at a distance so the desired orienting layer is deposited with the desired oblique impingement of the plasma material on the surface.

In the embodiment shown in the drawing the distance d between the substrate surface S' and the target 11 can be from 50 to 100 mm and the surface inclination angle a can be from 60° to 85°.

The targets 11 and 12 can each comprise a target plate.

While the invention has been illustrated and described as embodied in a process and apparatus for applying orienting layers to a substrate for alignment of liquid crystal molecules, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims.

We claim:

1. A process of making an orienting layer on a substrate for aligning liquid crystal molecules, said process comprising the steps of:

a) moving a substrate having a substrate surface in a substrate motion direction past at least one target having a cathode surface and providing said at least one target with a length l in a direction perpendicular to said substrate motion direction and parallel to said substrate surface, wherein said length l is at least equal to a width (s) of said substrate in said direction perpendicular to said substrate motion direction;

b) spacing said substrate a distance d of from 50 to 100 mm from said at least one target;

c) sputtering material from the at least one target onto the substrate surface by forming a gas plasma in a vacuum chamber containing the at least one target; and d) orienting the at least one target relative to the substrate so that the cathode surface of the at least one target is inclined at a surface inclination angle a of from 60° to 85° to the substrate surface so that the material is sputtered obliquely onto the substrate surface from the at least one target to grow prismatic crystals on the substrate surface and thus form the orienting layer.

2. The process as defined in claim 1, wherein said substrate is a liquid crystal display substrate of a large-scale liquid crystal display.

3. The process as defined in claim 1, further comprising producing a magnetic field in the vicinity of the cathode surface of the at least one target, said magnetic field comprising circular field lines extending in planes perpendicular to the cathode surface and parallel to the substrate motion direction to assist in growing said prismatic crystals and formation of the orienting layer.

4. The process as defined in claim 1, wherein the gas plasma is a high frequency plasma and the material is nonconducting.

5. The process as defined in claim 4, wherein the material is $SiO_2$.

6. The process as defined in claim 1, wherein the gas plasma is a direct current plasma for producing a member selected from the group consisting of metal oxide layers and metal nitride layers, and further comprising adding a reactive gas selected from the group consisting of oxygen and nitrogen to the gas plasma during said sputtering of the material on the substrate surface.

7. The process as defined in claim 1, further comprising limiting an impingement angle range for the material sputtered onto the substrate surface to a predetermined angular range and preventing plasma formation on the at least one target outside of the cathode surface by providing lateral shields around the at least one target.

8. An apparatus for making an orienting layer for aligning liquid crystal molecules on a substrate having a substrate surface, said apparatus comprising:

means for forming a gas plasma in a vacuum chamber for sputtering a material onto the substrate surface of the substrate, said means for forming the gas plasma comprising at least one target arranged in the vacuum chamber, said at least one target having a cathode surface;

means for moving the substrate past the at least one target in a substrate motion direction, said means for moving the substrate including a palette on which the substrate rests, means for spacing said substrate a distance d of from 50 to 100 mm from the at least one target;

wherein a length l of said at least one target in a direction perpendicular to the substrate motion direction and parallel to the substrate surface is at least equal to a width s of the substrate in said direction perpendicular to the substrate motion direction and the cathode surface of the at least one target is inclined at a surface inclination angle a of from 60° to 85° to the substrate surface so that the material may be sputtered obliquely onto the substrate surface to form the orienting layer.

9. The apparatus as defined in claim 8, further comprising another target located in the vacuum chamber for forming an insulating layer on said substrate prior to formation of the orienting layer.

10. The apparatus as defined in claim 8, further comprising means for limiting an impingement angle range of said material sputtered onto said substrate surface to a predetermined angular range and means for preventing plasma formation on the at least one target outside of said cathode surface, said means for limiting impingement angle and said means for preventing plasma formation comprising lateral shields around said at least one target.

* * * * *